United States Patent [19]
Coon

[11] Patent Number: 5,834,785
[45] Date of Patent: Nov. 10, 1998

[54] METHOD AND APPARATUS TO COMPENSATE FOR THERMAL EXPANSION IN A LITHOGRAPHIC PROCESS

[75] Inventor: Paul Derek Coon, Redwood City, Calif.

[73] Assignee: Nikon Corporation, Tokyo, Japan

[21] Appl. No.: 870,900

[22] Filed: Jun. 6, 1997

[51] Int. Cl.[6] .................................................. G01B 11/26
[52] U.S. Cl. ...................................... 250/492.2; 250/398
[58] Field of Search ........................... 250/492.2, 492.22, 250/398, 548; 355/53

[56] References Cited

U.S. PATENT DOCUMENTS

| | | | |
|---|---|---|---|
| 4,780,617 | 10/1988 | Umatate et al. | 250/548 |
| 4,780,747 | 10/1988 | Suzuki et al. | 355/68 |
| 4,908,656 | 3/1990 | Suwa et al. | 355/53 |
| 4,962,318 | 10/1990 | Nishi | 250/548 |
| 5,118,953 | 6/1992 | Ota et al. | 250/548 |
| 5,695,894 | 12/1997 | Clube | 430/1 |

FOREIGN PATENT DOCUMENTS 4-96315  3/1992  Japan .

OTHER PUBLICATIONS

"A New Analytical Model For Simulating Resist Heating In Electron Beam Lithography", Z. Cui, IOP Publishing, Ltd., 1992, pp. 919–923.

"Computer Simulation Of Resist Heating In Electron–Beam Lithography", Z. Cui, et al., 17 Microelectronic Engineering 395–398 (1992).

"Enhanced Global Alignment For Production Optical Lithography", S. Slonaker, et al., SPIE vol. 922 Optical/Laser Microlithography (1988) pp. 73–81.

Primary Examiner—Kiet T. Nguyen
Attorney, Agent, or Firm—Joseph T. FitzGerald

[57] ABSTRACT

Thermal expansion caused by the absorption of thermal energy from exposure dosages can cause misalignment and other problems in the exposure process. The present invention compensates for this problem by developing scaling and backlash coefficients based on the amount of amount of energy absorbed by the substrate undergoing the exposure process. Scaling and backlash are then compensated for in the alignment map which controls the exposure process. In this fashion, scaling and backlash are accounted for prior to exposure, thus ensuring the proper exposure during the lithography process.

17 Claims, 5 Drawing Sheets

METHOD AND APPARATUS TO COMPENSATE FOR THERMAL EXPANSION IN A LITHOGRAPHIC PROCESS

TECHNICAL FIELD

The present invention is directed to a method and apparatus for compensating for thermal expansion. More particularly, the present invention is directed to a method and apparatus for monitoring an amount of energy absorbed by a substrate during a lithographic process and controlling the process to compensate for the thermal expansion of the wafer due to the absorbed energy.

BACKGROUND OF THE INVENTION

The thermal expansion of substrates in lithographic processes is known. Thermal expansion occurs when, for example, semiconductor substrates, which are typically silicon wafers, absorb energy from the illumination of the substrate during the exposure process. Thermal expansion during exposure can cause misalignment if the wafer was aligned prior to exposure. While previously it may have been possible to ignore the effects of thermal expansion as being negligible, current photolithography systems are being faced with tighter and tighter overlay tolerances as linewidths in such systems get smaller and smaller.

For example, in the case of modern projection exposure systems using so-called i-line illumination from a high pressure mercury lamp as the illumination source (wavelength $\lambda=0.365$ $\mu$m), when such a system is used to produce semiconductor devices including multiple layers, the critical dimension (CD) (i.e. target linewidth) is typically in the range of 0.30–0.50 $\mu$m. In the case of projection exposure systems utilizing a KrF laser as the illumination source ($\lambda=0.248$ $\mu$m), the CD is typically in the range of 0.25–0.30 $\mu$m. For these CD values, the overlay tolerances between different layers have very tight specifications.

For example, typical design rules demand the overlay tolerances to be ⅓ to ¼ or less of the critical dimension. For an i-line production process ($\lambda=0.365$ $\mu$m) in which the critical dimension is on the order of 300 to 500 nm, the overlay tolerance is typically less than 150 nm. However, for a KrF production process ($\lambda=0.248$ $\mu$m) where the CD is in the range of 250 to 300 nm, the overlay tolerance is 100 nm or less. As these figures indicate, the tolerances demanded by lithography processes seeking to achieve reduced line widths have become such that the effect of thermal expansion is no longer negligible. While the expansion produced by a single shot may not significant, for large wafers (e.g. 8" with 64 shot areas of 22×22 mm) typically used in current lithography systems, the effects of absorption of thermal energy from the exposure process is a cumulative effect which must be addressed.

Those skilled in the lithography art will readily appreciate that the buildup of thermal energy is subject to a number of variables. For example, the illumination systems of different lithography equipment will each produce different energy doses for each "shot" or exposure of a field or shot area. The properties of the reticle or mask (e.g. the transmission efficiency), the number of existing layers on the wafer, the properties of the resist, the type of wafer holder, the materials used in the optical system as well as the type of optical system (e.g. straight projection optics, catadioptric or mostly reflective optics, electron optics for e-beam systems, etc.) all contribute to and can influence the energy dose and the buildup of thermal energy. For example, certain resists may require more or less exposure energy, thus affecting the amount of thermal buildup from the exposure process.

Given the number of variables involved, the buildup of thermal energy is difficult to predict mathematically. The effects caused by the thermal buildup, however, are readily known. For example, data developed by the inventor has shown typical post-exposure scaling errors are in the range of 0.2 to 0.4 ppm. While in theoretical terms a 0.2 ppm scaling error represents a 20 nm error at the edge of an eight inch wafer, due to the non-standard distribution of the error caused by scaling, the effect on the standard deviation is actually 30 nm. Furthermore, these values, and the effects caused by the buildup of thermal energy, are magnified as wafers get larger.

Accordingly, there is a clear need for a system which is capable of determining the buildup of thermal energy caused by the exposure process, and then compensating for the effects produced by the buildup of the thermal energy. Further, in order for such a system to be implemented in a production lithographic tool, it must be capable of compensating for effects of thermal buildup without increasing exposure times or decreasing the throughput of the lithographic tool. Such a system should be economical to implement and, as semiconductor manufacturers are known to utilize different lithographic tools in the manufacture of integrated circuits, such a system must be "platform independent," i.e., it must be usable in each lithographic tool used to fabricate integrated circuits from a given wafer or substrate. The compensation for thermal buildup on one or even several layers exposed by a first lithographic tool would be meaningless if the wafer were then supplied to a different lithographic tool which was incapable of such compensation. Such compensation should begin with the first level and be performed for each level in the lithographic process.

SUMMARY OF THE INVENTION

The present invention addresses the above and other problems caused by thermal buildup in lithographic tools and provides for on-the-fly compensation for the effects of such thermal buildup.

The preferred embodiment of the present invention addresses such problems by monitoring the amount of energy absorbed by the substrate undergoing the exposure process in the lithographic system. By determining the amount of energy absorbed by the substrate, it is possible to determine the amount of expansion, including scaling and backlash (i.e. the shift of exposed rows, typically along the direction of stepping), that will require compensation. By compensating for such expansion prior to exposure, it is possible to obviate the negative effects caused by the thermal absorption.

In accordance with a preferred embodiment of the present invention, the amount of energy absorbed by the wafer is determined by monitoring the initial energy in the illumination dosage supplied by the illumination system, the reflectance in the optical system, and the substrate reflectance. From these values it is possible to determine the amount of energy which is incident on, reflected by and absorbed by the substrate.

The relationship between thermal absorption and both scaling and backlash may be developed empirically in a calibration routine in which a number of substrates of the type which are to be processed using the lithographic system are exposed on a given substrate support structure using different exposure energies. By obtaining a number of data points indicative of the relationship between energy absorption and both scaling and backlash, it is possible to develop coefficients for scaling and backlash which are related to the amount of energy absorbed by the substrate. In this manner, by determining the amount of energy absorbed by a similar substrate undergoing an actual production exposure sequence on a lithographic tool having a similar substrate support structure, it is possible to compensate for scaling and backlash caused by thermal absorption. This compensation is performed in one embodiment of the present invention by adjusting the alignment map used to control the exposure process by an amount determined by the scaling and backlash coefficients corresponding to the amount of absorbed energy.

The above and other features and advantages of the present invention will become more apparent upon a reading of the detailed description of the present invention when considered in conjunction with the drawings, of which the following is a brief description.

DETAILED DESCRIPTION OF THE PREFERRED EMBODIMENTS

Figure 1:
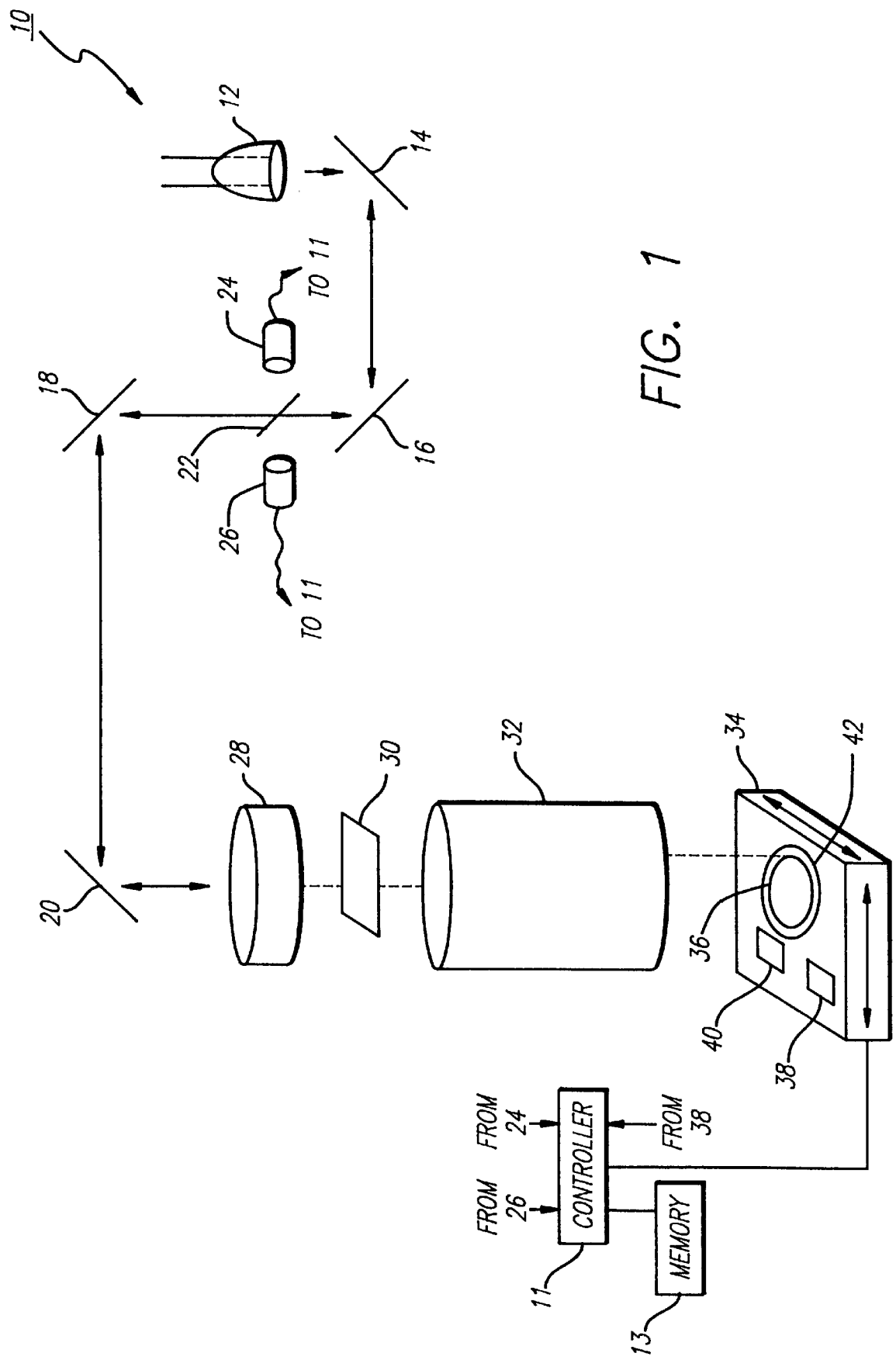
FIG. 1 is a block diagram of a lithographic system in accordance with one embodiment of the present invention.

The following detailed description is of the presently preferred embodiments of the present invention. However, the present invention is in no way limited to the embodiments discussed below or shown in the drawings. Rather, the present invention is solely limited by the claims appended to this specification. In the drawings, like reference numbers refer to like elements.

FIG. 1 is a block diagram of a lithography system 10 in accordance with a first embodiment of the present invention. Of course, those skilled in the art will readily appreciate that there are numerous additional components in a typical lithography system which are not included in FIG. 1 to ease the discussion of the present invention. Such components, which may include, for example, a fly's eye integrator lens system, reticle blinds, etc., are known and do not form a part of the present invention.

Referring to FIG. 1, lithography system 10 includes a source of illumination 12. For purposes of the discussion which follows, it will be assumed that the source of illumination 12 is a high pressure mercury lamp in combination with a parabolic mirror. Such a system can produce so-called i-line illumination having a wavelength $\lambda=0.365$ $\mu$m. It should be clear however that the present invention is in no way limited to systems which utilize this wavelength for the illumination source. Illumination source 12 may be a krypton fluoride laser (KrF–$\lambda=0.248$ $\mu$m), argon fluoride laser (ArF–$\lambda=0.193$ $\mu$m), other ultraviolet radiation sources, electron beam, or any other suitable illumination device or radiation source.

The source of illumination 12 produces a beam of illumination identified by the arrows which is reflected via mirrors 14, 16, 18 and 20. The illumination is supplied to the condenser lens 28. A halving mirror (beam splitter) 22 intersects the beam at a point positioned between reflectance sensor 24 and output sensor 26. The halving mirror 22 allows a portion of the illumination from the illumination source 12 to be reflected to the sensors 24 and 26. Of course, other illumination paths are possible and the present invention is not limited to any particular illumination path. For example, the number of mirrors may be reduced, the halving mirror may be repositioned, etc.

Reflectance sensor 24 is used for calibration purposes to measure the reflectance of the lithographic system 10. The output sensor 26 is used to determine the initial energy of the illumination source prior to entry of the beam into the condenser lens. In i-line lithographic systems which utilize mercury arc lamps, it is important to monitor the intensity of the illumination provided by the lamp. Mercury arc lamps typically experience a decline in intensity on the order of 20% or more over the useful life of the lamp. This decline in intensity is generally compensated for by increasing the exposure time by a corresponding amount or adjusting the electric power input to the lamp. Of course, those skilled in the art will realize that the position of the sensors 24 and 26 is not limited to the placement shown in the drawings. Such sensors may be placed in any suitable location in the lithographic system.

Illumination from the illumination source 12 is supplied to the condenser optics 28 which in turn illuminate the reticle 30. The reticle 30 has a transmission percentage which varies depending on the nature of the mask. In the case of i-line illumination, the average transmission percentage is approximately 25%, but can be in the range of 1% to 50% or more. The illumination which passes through the reticle 30 is received by the projection optics 32. The projection optics are typically situated above (in the case of a vertical projection system), but may be adjacent to (in the case of a horizontal projection system), the movable stage or bearing 34 on which is positioned a wafer or substrate 36. For the discussion which follows, reference will be made interchangeably to wafer or substrate. It should be understood that the present invention is in no way limited to the exposure of wafers using a lithography system. The system of the present invention is usable with other lithographic processes, including exposing silicon, gallium arsenide (GaAs), glass, or any other suitable material or substrate which may be subject to a lithographic process. As discussed in more detail below, the wafer 36 is supported and constrained on the movable stage or bearing 34 by a wafer or substrate chuck 42.

In the vicinity of the stage 34, which may be formed of any suitable material including metal, metal alloy, ceramic, or composite material, for example silicon carbide, there is provided a transmission sensor 38 which measures the intensity of the illumination incident on the stage 34 through the projection optics 32. A mirror 40 which may be positioned on stage 34 is used together with reflectance sensor 26 in a calibration sequence to calibrate the reflectance of the system, while the reflectance sensor 26 is also used to detect the wafer or substrate reflectance. Using these values, the amount of illumination reflected from (and hence absorbed by) the wafer 36 can be determined. The energy absorbed by the wafer is determined by subtracting the amount of energy reflected from the wafer from the total energy incident on the wafer 36. The energy absorbed by the wafer may be calculated in other ways without departing from the scope of the present invention. For example, U.S. Pat. No. 4,780,747, which patent is incorporated herein by reference in its entirety, discloses using sensors and a mirror in order to calculate the reflectivity of a wafer in a lithographic system.

As those skilled in the art will readily appreciate, a controller identified as 11 controls the operation of the lithographic system 10. As is known to those skilled in the art, the controller will typically include multiple processors with supporting circuitry working together to control and monitor the numerous elements in the exposure system. Such processors can include microprocessors manufactured by Intel, Digital Equipment Corp., Motorola, or any other suitable processor. The controller 11 receives input from the sensors in the lithographic system, including the reflectance sensor 24, output sensor 26, and transmission sensor 38. A memory 13 is typically associated with controller 11. Memory 13 may be used to store, for example, control programs for controlling the lithographic exposure sequences, including pre-exposure calibration sequences, exposure sequences, alignment system control, etc. In addition to controlling the position of the movable stage 34, controller 11 performs the calculations necessary to determine the amount of energy in the incident illumination, the wafer reflectance, system reflectance, energy absorption, etc., based on the input received from the respective sensors in the lithographic system 10 as will be discussed in more detail below.

Figure 2:
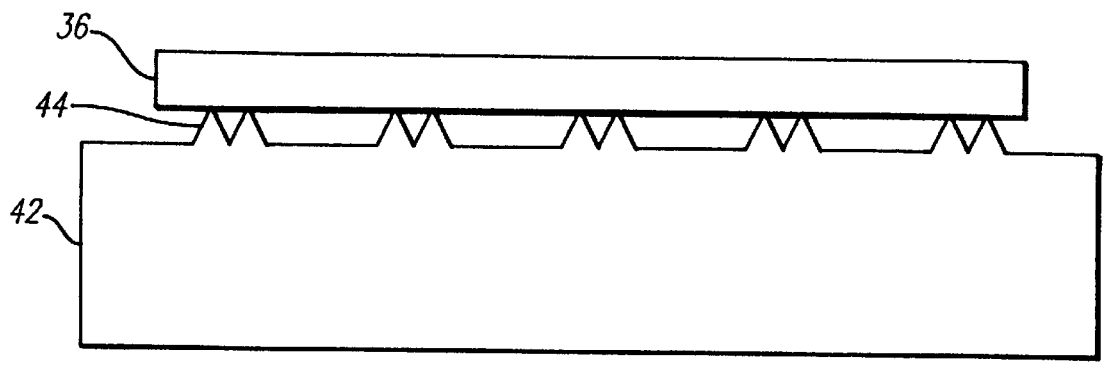
FIG. 2 is a side view of a substrate support structure used in a lithographic system such as that illustrated in FIG. 1.

Referring to FIG. 2, the wafer 36 is supported and constrained on the movable stage 34 by the wafer chuck 42. Wafer chuck 42 includes a series of protrusions or support points 44 which provide for low contact support of the wafer 36 to reduce the possibility of contaminating the wafer surface. The wafer chuck 42, which may also be made of any suitable material including metal, metal alloy, ceramic or composite material, for example silicon carbide, typically constrains the wafer using a vacuum (not shown). This form of wafer constraint is known to those skilled in the art.

During the development of the instant invention, it was determined that the force used to constrain the wafer 36 provided sufficient force to prevent the thermal expansion and contraction of the wafer 36 independent of the wafer chuck 42 due to energy transfer from the exposure process. However, the inventor examined the effects of thermal absorption and determined that a thermal transfer occurred between the wafer 36 and the wafer support structure, in this case the wafer chuck 42. Based on these observations, the inventor determined expansion and contraction of the wafer or substrate 36 still occurred, and the wafer chuck 42 was actually the determining factor in the thermal expansion and contraction associated with absorption of thermal energy from the exposure of the wafer.

Figure 3:
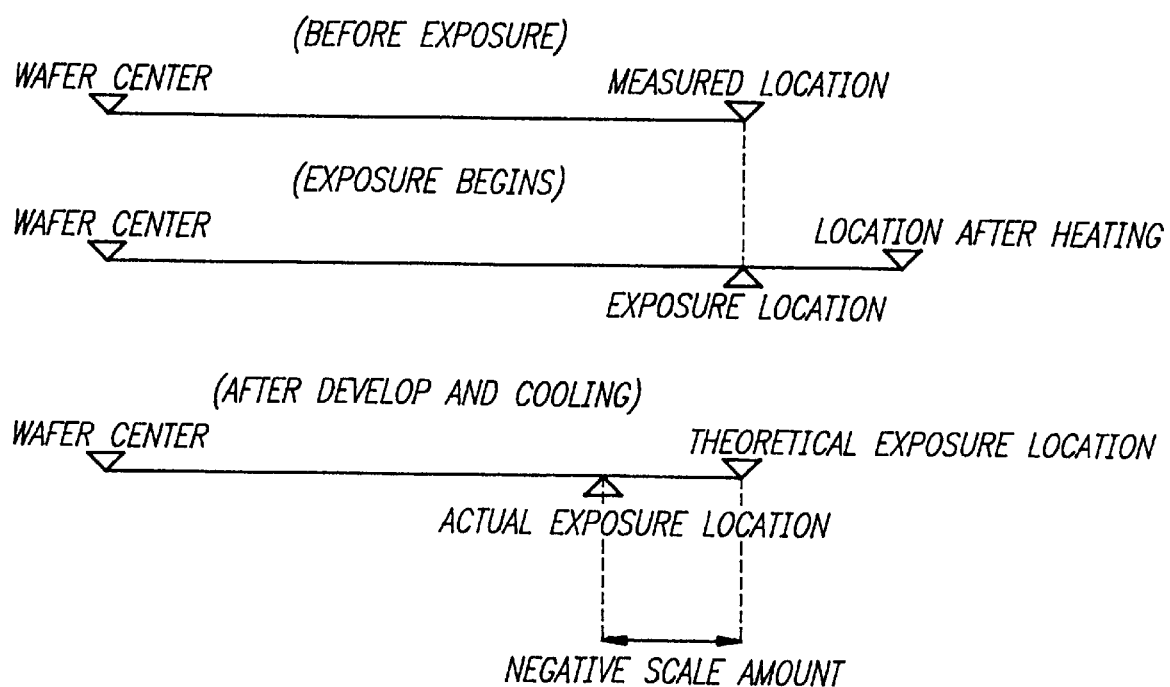
FIG. 3 illustrates effects of thermal expansion and contraction in a lithography process.

Referring to FIG. 3, the effects of thermal expansion on the lithography process can be readily seen through a demonstration of the scaling effect. Prior to exposure, the location of the exposure is identified by measurements typically conducted by an alignment system in the lithographic tool and stored in an alignment map used by the tool to control the exposure process. The exposure process then begins and the effects of energy absorption are seen in that the exposed location has now shifted to the right due to the effects of thermal absorption. After all of the shot areas have been exposed, the resist is developed and the wafer cools. After the wafer cools, the measured location which initially expanded to the right of the measured location now appears to the left of the measured location, resulting in an overall negative scaling effect.

Although it was determined that the wafer chuck 42 prevented expansion and contraction of the wafer 36 independent of the chuck 42, by observing the effects of thermal absorption in a number of wafers exposed with different exposure doses on similar wafer chucks, the inventor determined that it was not necessary to monitor the thermal energy absorbed by the wafer chuck 42. Rather, the inventor determined that it was possible to develop compensation coefficients for thermal absorption based on the amount of energy absorbed by the wafer or substrate 36. Such compensation coefficients would be suitable to compensate for thermal absorption from the exposure process provided that the same type of wafer holder was utilized for each exposure of the wafer or substrate. If different types wafer holders were to be utilized, a separate set of coefficients would need to be developed for each type of holder.

As those skilled in the art will readily appreciate, the ability to derive compensation coefficients by looking only at the wafer or substrate makes it possible to utilize existing monitoring devices within most lithographic tools to derive the data necessary to determine compensation coefficients for thermal absorption. Of course, it is also possible and within the scope of the present invention to monitor the wafer or substrate holder to derive the data for determining the compensation coefficients for thermal absorption. Temperature sensors could be disposed in the holder to monitor thermal absorption in the holder.

Figure 4:
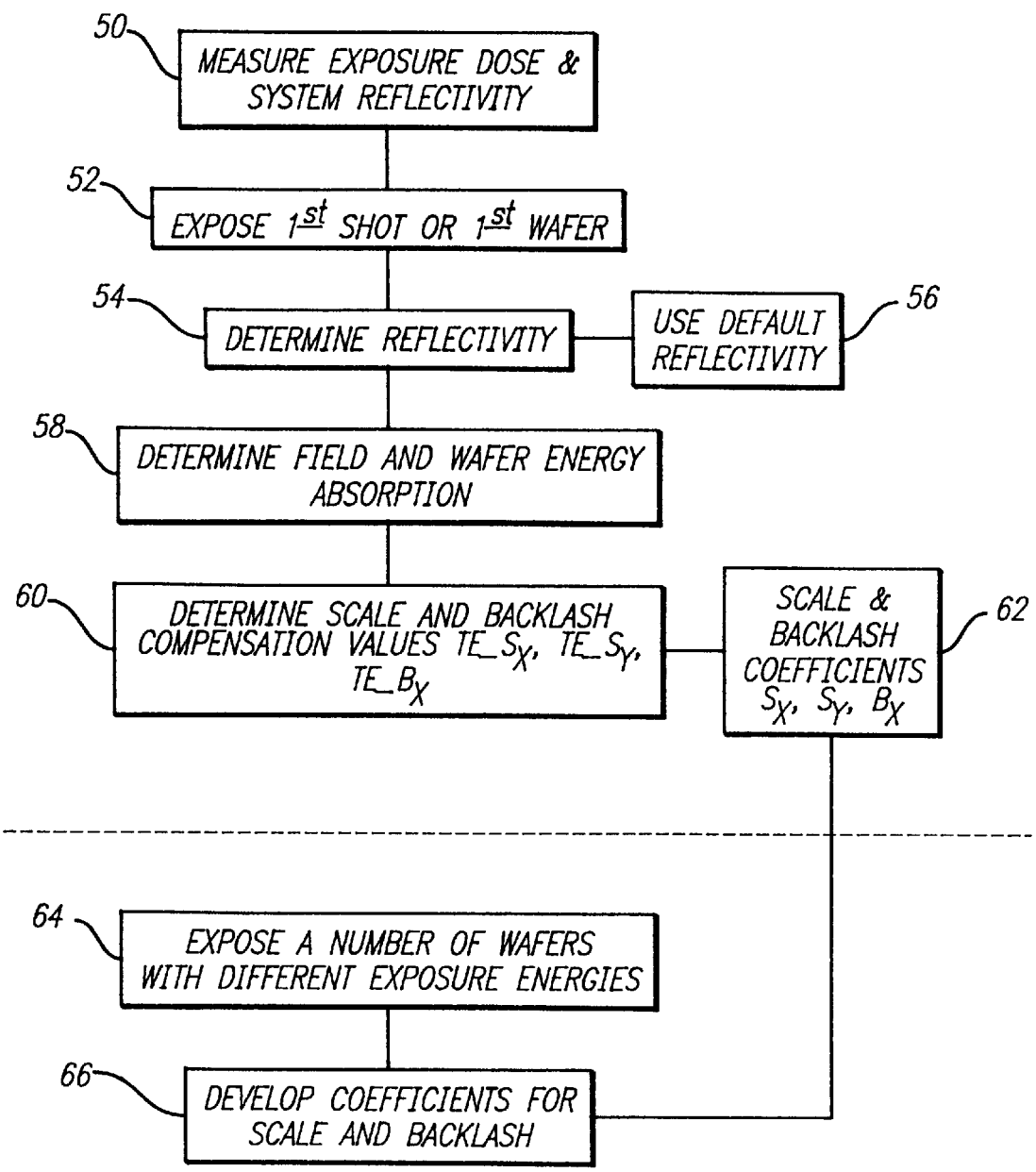
FIG. 4 is a flow chart of a method for obtaining compensation coefficients for thermal expansion in accordance with an embodiment of the present invention.

Referring to FIG. 4, a method for determining compensation values for thermal absorption in a lithographic tool is disclosed. The method of FIG. 4 is performed by controller 11 which is used to control the exposure process in the lithographic tool. Compensation values are determined by first measuring the exposure dose and system reflectivity at step 50. This is accomplished, for example, using the transmission sensor 38 and reflectance sensor 24.

More specifically, in a pre-exposure calibration sequence, the amount of energy which reaches the wafer 36 (i.e. the exposure dose) is detected by the transmission sensor 38. The system reflectance is also determined in the pre-exposure calibration sequence by illuminating mirror 40 which has a known reflectance and detecting the reflectance using reflectance sensor 24. This provides a reference value which enables the determination of the wafer reflectance once the wafer is exposed.

The method then proceeds to step 52 in which the wafer is subjected to the exposure process. Next, in step 54 the measurement and determination of the reflectivity of the wafer is conducted. Specifically, when the wafer 36 is exposed, the reflectance sensor 24 detects the reflectance. By subtracting the known system reflectance determined during the calibration sequence, it is possible to determine the wafer reflectance.

For the first shot or wafer, however, a default reflectivity value is provided at step 56. The typical default value is less than 50% and is preferably on the order of 10–30%. Of course, depending on the nature of the process being performed by the user, and the properties of the materials being utilized in the process, the user may specify a different default value.

The specified default value is used for the first shot or wafer since the exposure process must be completed prior to determining the reflectivity. Typically this is done after the first wafer is exposed due in part to the difficulty of trying to adjust for reflectivity variations between shots during the exposure of a wafer. Further, since the first shot in the exposure sequence for a wafer may, for example, be a partial shot due to the location of the first shot area (e.g. on the edge of the wafer), utilization of the first shot to determine a reflectivity value for the wafer may lead to a miscalculation. Accordingly, the inventor has determined that it is preferable to utilize a default value for the reflectivity in exposing the first shot or wafer. Of course, those skilled in the art will readily appreciate that it may be possible to avoid using default values and the present invention is not limited to the use of default values for the first wafer exposure.

The method proceeds to step 58 in which the wafer energy absorption is calculated. By measuring the intensity of the incident illumination using transmission sensor 38, and subtracting the amount of reflected energy determined using the reflectance detected by the reflectance sensor 24, the amount of energy absorbed by the wafer is determined.

More specifically, the controller 11 calculates wafer energy absorption by first determining the amount of field energy absorption $f_e$, i.e. the amount of energy absorbed by the wafer during the exposure of a single field. To do this, controller 11 receives a signal from transmission sensor 38 indicative of the exposure energy $E_e$ incident on the exposure area from an exposure dose. Since some of the energy is not absorbed, but rather is reflected, it is necessary for the controller 11 to subtract from the total incident energy the amount of reflected energy, $r_e$. The reflected energy is derived by the controller 11 from the reflectance detected by reflectance sensor 24 (adjusted to take into account the system reflectivity determined in the pre-exposure calibration sequence and stored in memory 13). The difference between the incident exposure energy and the reflected energy represents the field energy absorption. This difference value is then multiplied by the known number of fields or exposure areas on the wafer to determine the total amount of energy absorbed by the wafer.

The calculation of the energy absorption can be expressed as follows:

$$W_e = (E_e - r_e) * \text{\# of fields}$$

where,
$W_e$ is the total absorbed wafer energy;
$E_e$ is the exposure energy; and
$r_e$ is the energy reflected from the field being exposed.

The absorbed field energy $f_e$, is the difference between the exposure energy and reflected energy $(E_e - r_e)$.

Of course, if default values are used for any of the values used to calculate the absorbed energy, the calculated value will be an approximation of the absorbed energy. Depending on the accuracy required, the determination of compensation values may be based on an approximation of the absorbed energy instead of an actual measurement.

The system then proceeds to step 60 where the scaling and backlash are adjusted based on the detected amount of absorbed energy. Specifically, the scaling effect (e.g. FIG. 3) is a function of the total energy absorbed by the wafer, $W_e$, while the backlash effect is a function of the absorbed field energy, $f_e$. As mentioned above, scaling is the expansion or contraction of the wafer as a whole, while backlash is the left to right shift of the exposed rows (assuming a left to right stepping motion). While scale has separate values for X and Y directions, the inventor has determined that for current applications backlash need only be compensated for in the direction of stepping. Thus there are X and Y coefficients $S_X$ and $S_Y$ for scale, and an X coefficient $B_X$ for backlash (for stepping in the X direction).

The scale coefficients $S_X$ and $S_Y$ are expressed in terms of parts-per-million/joule (absorbed wafer energy) whereas the backlash coefficient $B_X$ is expressed in terms of $\mu$m/joule (absorbed field energy). So, to determine the amount of scaling compensation, the scale coefficients $S_X$ and $S_Y$ are multiplied by the total absorbed wafer energy $W_e$ determined in step 58 to obtain the amount of X and Y scale compensation, TE_$S_X$ and TE_$S_Y$, respectively. Similarly, the backlash coefficient $B_X$ is multiplied by the absorbed field energy $f_e$, thus providing the amount of backlash compensation, TE_$B_X$. While it is possible to mathematically predict the scale and backlash coefficients S and B supplied in step 62, in the preferred embodiment of the present invention such coefficients are developed empirically during a calibration procedure identified in steps 64 and 66 and then stored in memory 13.

Calibration steps 64 and 66 are separated from the remainder of the flow chart in FIG. 4 to signify that such steps are performed in a separate calibration sequence. This calibration sequence may be performed prior to delivery of the lithography machine by the manufacturer or may be performed at the fabrication site where the lithography system is installed. Of course, if done by the manufacturer, the manufacturer must be aware of the type and size of substrate to utilize in the calibration sequence. Specifically, in step 64, a number of sample wafers or substrates are exposed using different exposure energies. From these test exposures the relationship between the amount of scaling and backlash and the absorbed energy is developed in step 66.

Figure 5:
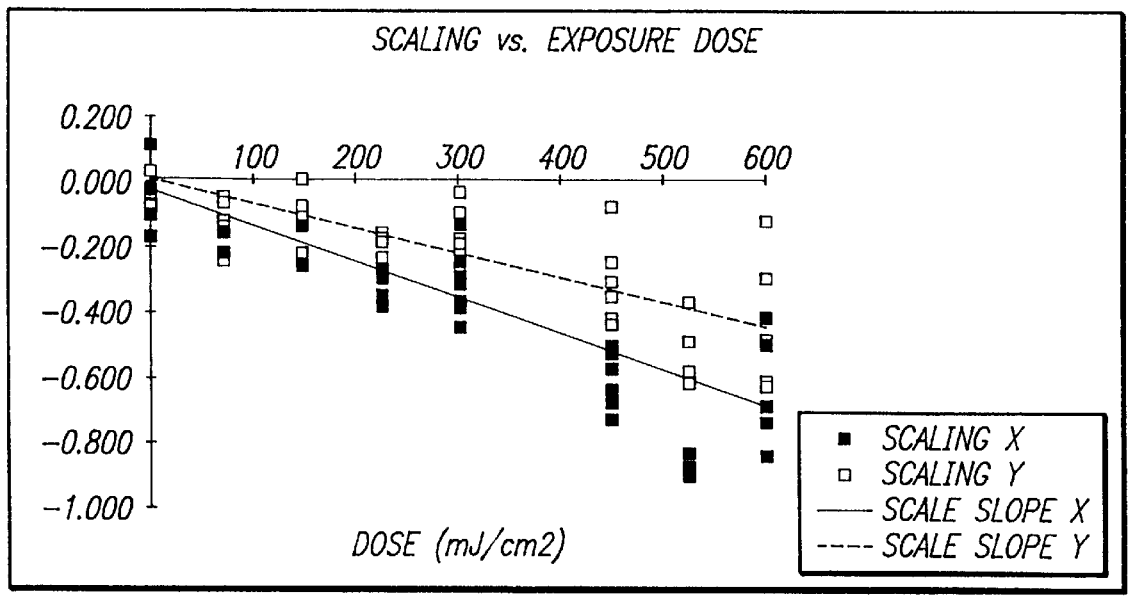
FIG. 5 is a shot map used to map the locations of the exposure areas on a substrate in accordance with one embodiment of the present invention.
Figure 6:
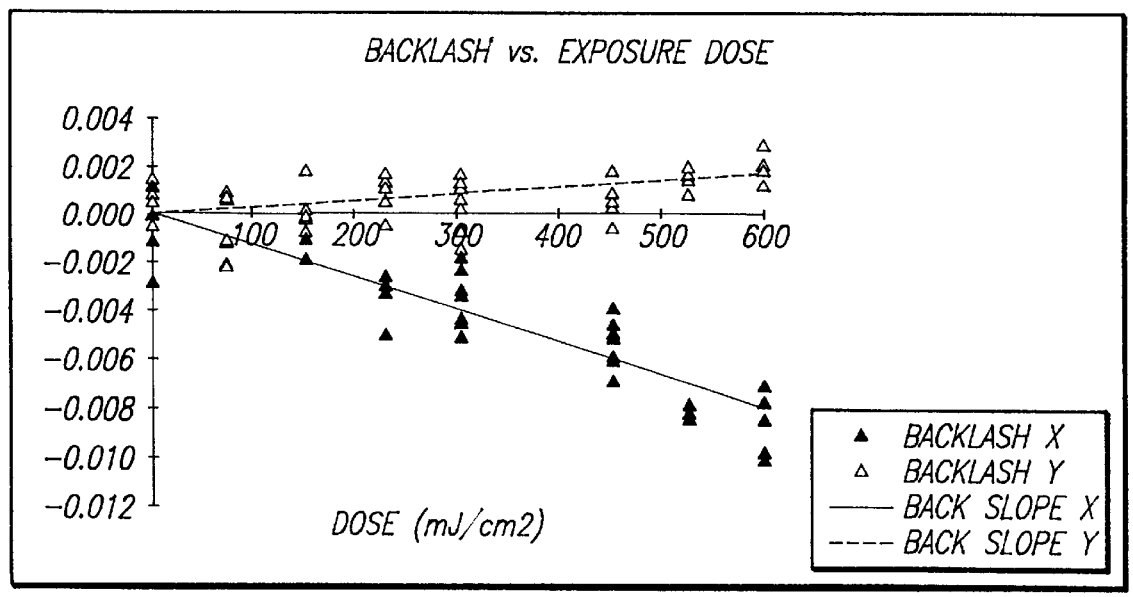
FIG. 6 is a flow chart of a method for exposing a substrate while compensating for thermal expansion in accordance with the present invention.

Referring to FIGS. 5 and 6, graphical data indicative of the relationship between scaling and backlash and the exposure energy is illustrated. As seen in FIG. 5, scaling occurs in two dimensions, X and Y. By exposing a number of wafers and gradually increasing the exposure energy from zero to 600 mJ/cm$^2$, a number of data points for X and Y scaling (in ppm) are obtained. The expansion or contraction of the wafer in the X and Y directions may be measured using any suitable measuring technique. Preferably, such measurements are performed using the laser step alignment system discussed in more detail below. One the measurements are completed, the measured data points can be plotted and, for example, a linear approximation can be derived. The slope of the linear approximation may then be obtained (the solid line for the X scale factor, the dashed line for the Y scale factor) and used as the coefficients $S_X$ and $S_Y$, respectively. These coefficients are stored in memory 13 and are multiplied at step 60 by the determined amount of absorbed wafer energy $W_e$ to provide the scale compensation values TE_$S_X$ and TE_$S_Y$.

As seen in FIG. 6, the backlash coefficients may be determined in a similar manner. As illustrated in the FIGURE, detected X and Y backlash values in $\mu$m are measured and plotted against the exposure dosage, linear approximations are made and the slopes of the linear approximations become backlash coefficients $B_X$ and $B_Y$. As discussed above, given the size of the Y backlash effect observed by the inventor, it was determined that this effect was negligible and need not be compensated. Of course, the skilled artisan would readily appreciate that compensation for backlash in two directions can easily be provided by the present invention if desired or demanded by more rigorous process specifications in the future. As with the scale coefficients, the backlash coefficient is also stored in memory 13 and is multiplied at step 60 by the determined amount of absorbed field energy $f_e$ to obtain the backlash compensation value TE_$B_X$.

Of course, those skilled in the art will also appreciate that the accuracy of the measurements and the type of approximation from such measurements can influence the accuracy of the coefficients for scale and backlash. For example, the inventor utilized an LSA measurement system (discussed below) having a resolution limit of 5 nm to obtain the data illustrated in FIGS. 5 and 6. A linear approximation was then derived from the data to obtain compensation coefficients for scale and backlash. A higher resolution measurement system or non-linear approximation, or both, may be utilized with the present invention depending on the accuracy required for the thermal compensation.

Figure 7:
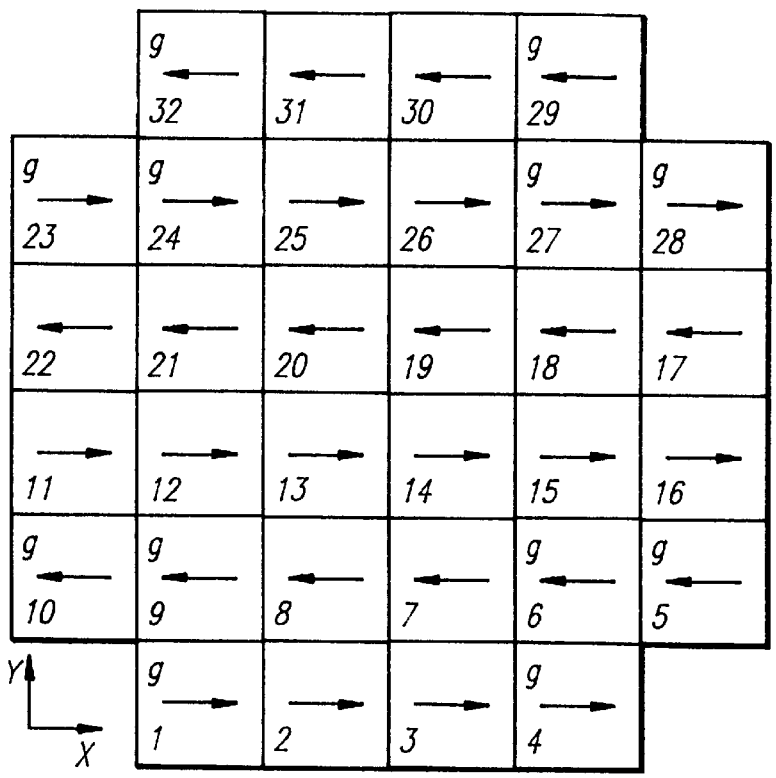
FIG. 7 graphically illustrates the relationship between scaling in the X and Y directions and exposure energy.

Once the scale and backlash compensation values have been determined in the above-described fashion, such values must be utilized by the lithographic tool to compensate for scale and backlash in connection with exposure process. More specifically, in a typical step and repeat (or step and scan) lithography system, the wafer is divided up into a series of "shot areas" or exposure fields which are typically exposed in a sequential fashion. Referring to FIG. 7, a typical shot map for a six inch wafer is illustrated. It is to be understood that this shot map is for illustration purposes only and that the present invention is not limited to use with six inch wafers or shot maps such as that shown in the FIGURE.

In this shot map, there are 32 exposure fields numbered 1 through 32 and the exposure order is from bottom left to top left. That is, the system will first expose shot area 1, then "step", i.e. move the stage 34 in the direction of the arrow and expose shot area 2, and so on, proceeding sequentially through to shot area 32. This type of exposure sequence is known as boustrophedonic stepping (i.e. back and forth across the wafer). The shot areas in FIG. 7 which include the letter "g" may be utilized by the alignment system as will be discussed in more detail below.

The stepping described above which occurs in the exposure sequence results in the phenomenon of backlash. More specifically, referring to FIG. 7, classically backlash occurs due to, for example, hysteresis in the stage motors (not shown) used to position the substrate 36 for each shot. However, thermal expansion will cause this effect when the stepping pattern is boustrophedonic. As mentioned above, the amount of the compensation is determined empirically in calibration steps 64 and 66 in FIG. 4. However, due to the nature of the stepping, i.e. back and forth, the amount of compensation is added to or subtracted from a target location determined by the alignment system in the lithographic tool. That is, for left to right stepping (i.e. right to left motion of the substrate) the backlash compensation value is added to the target position and for right to left stepping (i.e. left to right motion of the substrate) the compensation value is subtracted from the target position.

Thus, in the example seen in FIG. 7, for the first, third and fifth rows (i.e., the odd rows) in the exposure sequence, the amount of compensation is added, whereas for the second, fourth and sixth rows (i.e., the even rows) in the exposure sequence, the compensation is subtracted. Of course, those skilled in the art will appreciate that the stepping direction and pattern can vary according to the lithographic equipment used. For example, it is possible for the stepping pattern to be predominantly in the Y direction instead of X, and in such case, the compensation for backlash would be along the direction of the Y axis.

Figure 8:
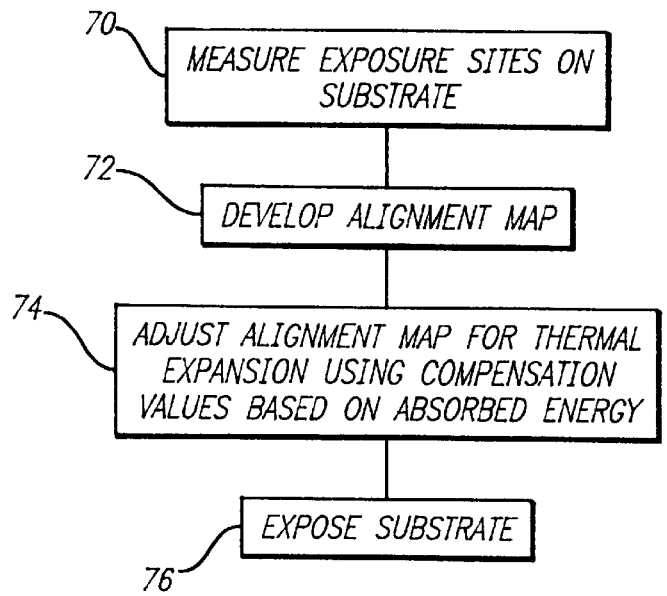
FIG. 8 graphically illustrates the relationship between backlash in the X and Y directions and exposure energy.

Referring to FIG. 8, a flow chart of an exposure process which includes compensation for the scale and backlash determined in FIG. 4 is illustrated. In step 70, selected exposure sites on the wafer are first measured using an automated alignment system such as the Laser Step Alignment ("LSA") method which is described in detail in U.S. Pat. No. 4,908,656, entitled "METHOD OF DIMENSION MEASUREMENT FOR A PATTERN FORMED BY EXPOSURE APPARATUS, AND METHOD FOR SETTING EXPOSURE CONDITIONS AND FOR INSPECTING EXPOSURE PRECISION," which patent is incorporated herein by reference in its entirety. The LSA system utilized in the '656 patent employs a laser to automatically detect and measure alignment marks with high precision.

For example, these alignment marks may be on the edge of the wafer, or may be in locations such as those identified in FIG. 7 with the letter "g" in addition to a number. Any number of alignment locations may be chosen and the present invention is not limited to the number or locations illustrated in FIG. 7. Of course any suitable alignment system may be utilized with the present invention, for example the Field Image Alignment ("FIA") technique which is described in U.S. Pat. No. 4,962,318, which patent is incorporated herein by reference in its entirety, the Laser Interferometric Alignment ("LIA") technique described in U.S. Pat. No. 5,118,953, which patent is incorporated by reference in its entirety, or any other suitable alignment technique.

Referring again to FIG. 8, once the exposure sites on the wafer are measured using the desired alignment technique, an alignment map is developed in step 72. The alignment map is used by the lithography system as a "road map" to locate exposure areas on the wafer. In the preferred embodiment of the present invention, an alignment map is developed by conducting a statistical analysis of the measurements taken in step 70 and producing values for scaling (X and Y), rotation, orthogonality and translation (X and Y). These six values can be used to determine any X, Y location on the substrate. Those skilled in the lithography art will readily appreciate that the values for scaling in the X and Y directions contained in the alignment map are not due to thermal absorption from the exposure process but other process conditions such as implantation, etching deposition, oxidation, CMP, or thermal absorption not caused by the exposure process.

There are numerous techniques for developing alignment maps including, for example, the Enhanced Global Alignment ("EGA") technique which is the preferred method for use with the present invention. This technique, which is well known to those skilled in the art, is described in detail in S. Slonaker, et al., "Enhanced Global Alignment For Production Optical Lithography," Proc. Of SPIE, Vol. 992, Optical/Laser Microlithography, pp. 73–81 (1988), which article is incorporated herein by reference. In addition, U.S. Pat. No. 5,118,953, which patent is incorporated by reference in its entirety, also discloses a technique for developing an alignment map suitable for use with the present invention.

The EGA technique, which uses the LSA system to provide measurements, produces six variables which contribute to overlay error: i) translation in X; ii) translation in Y; iii) scaling in X; iv) scaling in Y; v) Wafer rotation; and vi) orthogonality error. From these six variables, it is possible to calculate any location on the substrate being subjected to the lithographic process using the following exposure equation:

$$\begin{bmatrix} X \\ Y \end{bmatrix} = \begin{bmatrix} 1 + \text{Scale}X & -(\text{Rot} + \text{Orth.}) \\ \text{Rot} & 1 + \text{Scale}Y \end{bmatrix} \begin{pmatrix} x \\ y \end{pmatrix} + \begin{pmatrix} \text{Trans}X \\ \text{Trans}Y \end{pmatrix}$$

where,

X, Y are the actual target positions on the wafer in an X, Y coordinate system;

x, y are the pre-alignment target positions on the wafer in an X, Y coordinate system;

ScaleX and ScaleY are the scale values in the X and Y directions, respectively, which account for any expansion or contraction which may have occurred in the substrate due to process conditions;

TransX and TransY are the translation values in the X and Y directions, respectively, due to, e.g., mismatch in the baselines of the exposure tools used at various exposure levels;

Rot. is the wafer rotation value which is used to compensate for pattern rotation; and Orth. is the orthogonality value which is used to compensate for any mismatch in the X-Y coordinate system definitions of exposure tools used at previous exposure levels (i.e. lack of orthogonality between substrate stage X and Y mirrors).

Once the above six values are determined, it is possible to determine precisely the location of every X, Y exposure location on the substrate. However, an alignment map and exposure equation produced in accordance with the above procedure does not take into account the changes due to thermal absorption caused by the exposure process.

That is, while the above-described values obtained using the EGA system are useful for determining pre-exposure locations on the substrate, the inventor has determined that thermal absorption during the exposure process will introduce further scaling and backlash errors which are not unaccounted for in the above-described technique and which can result in misalignment in the exposure process.

Accordingly, referring again to FIG. 8, once the alignment map is developed, the values of the alignment map are adjusted in step 74 using the thermal expansion coefficients for scaling and backlash developed in step 60 of FIG. 4. In particular, the scale X and scale Y values determined using the EGA system are adjusted by the values determined in step 60, and the backlash value is added to the alignment map. The backlash value is used to adjust the X position (positive or negative depending on the row being exposed) of each shot area. The adjustment to the alignment map results in a new exposure equation as follows:

$$\begin{bmatrix} X \\ Y \end{bmatrix} = \begin{bmatrix} 1 + \text{Scale}X + TE\_S_X & -(\text{Rot} + \text{Orth.}) \\ \text{Rot} & 1 + \text{Scale}Y + TE\_S_Y \end{bmatrix} \begin{pmatrix} x \\ y \end{pmatrix} +$$

$$\begin{bmatrix} \text{Trans}X \\ \text{Trans}Y \end{bmatrix} + \begin{bmatrix} \pm TE\_B_X \\ 0 \end{bmatrix}$$

where, $TE\_S_X$ and $TE\_S_Y$ represent the scale compensation values in the X and Y directions due to thermal absorption from the exposure process; and $TE\_B_X$ represents the backlash compensation values in the X direction due to thermal absorption from the exposure process.

Once the alignment map has been adjusted for the effects of thermal absorption, the wafer or substrate is then exposed in step 76, with the exposure being controlled by the controller 11 in accordance with the values set forth in the alignment map. Thus, the exposure of the wafer is compensated for scaling and backlash due to thermal absorption.

If backlash adjustment in the Y direction is desired, the above matrix expression would be adjusted to provide a Y direction backlash compensation value as follows:

$$\begin{bmatrix} X \\ Y \end{bmatrix} = \begin{bmatrix} 1 + \text{Scale}X + TE\_S_X & -(\text{Rot} + \text{Orth.}) \\ \text{Rot} & 1 + \text{Scale}Y + TE\_S_Y \end{bmatrix} \begin{pmatrix} x \\ y \end{pmatrix} +$$

$$\begin{bmatrix} \text{Trans}X \\ \text{Trans}Y \end{bmatrix} + \begin{bmatrix} \pm TE\_B_X \\ \pm TE\_B_Y \end{bmatrix}$$

where $TE\_B_Y$ represents the backlash compensation values in the Y direction due to thermal absorption from the exposure process.

As with the X direction backlash compensation value, the Y direction backlash compensation value is obtained by multiplying the Y direction backlash coefficient $B_y$ with the determined absorbed exposure field energy.

Those skilled in the art will readily appreciate that the present invention allows for automated compensation of the lithographic process due to the effects of thermal energy absorption. As lithographic processes continually increase the density in shot areas by reducing line widths, alignment issues are becoming an even more crucial factor in achieving a successful wafer exposure. Thermal expansion as a result of the exposure process does not necessarily pose a problem at larger linewidths, but can result in significant alignment problems at reduced linewidths. Such problems can ultimately result in misalignment. The present invention provides a system for compensating for such problems which is usable in virtually all lithographic systems. The present invention will improve performance in systems with larger linewidths and obviate alignment problems in lithographic systems which achieve reduced linewidths (e.g. systems using ArF, KrF, or extreme ultraviolet illumination).

While the present invention has been described in terms of a preferred embodiment above, those skilled in the art will readily appreciate that numerous modifications, substitutions and additions may be made to the disclosed embodiments without departing from the spirit and scope of the present invention.

For example, although methods have been described above to determine the reflectivity of the system, the energy absorbed by the wafer, the reflectivity of the wafer, etc., those skilled in the art will readily appreciate that any suitable method may be utilized to determine these values and that the present invention is in no way limited to the methods described above. Further, while the present invention preferably detects the reflectivity of the system and the wafer as well as the energy in the incident illumination in determining energy absorption, it is possible to utilize default values in the determination of the absorbed energy. That is, the determination of the absorbed energy may be an approximation as in the first exposure of a shot area or wafer. Compensation may then be performed based on the approximated absorbed energy.

Similarly, the skilled artisan will readily appreciate that the lithography system shown in FIGS. 1 and 2 is but one of numerous types of lithography systems. The present invention is in no way limited to use with a particular type of lithography system, a particular wafer chuck, or to a particular wavelength of illumination for the lithography system.

It is intended that all such modifications, substitutions and additions fall within the scope of the present invention which is best defined by the claims below.

I claim:

1. A method to compensate for thermal absorption in an exposure process in a lithographic system, the method comprising the steps of:
   a. illuminating a substrate with at least one dose of illumination from a source of illumination;
   b. determining an amount of thermal energy absorbed by the substrate as a result of the illumination of the substrate; and
   c. adjusting the exposure process by an amount corresponding to the amount of thermal energy absorbed by said substrate to compensate for backlash caused by the thermal absorption.

2. The method according to claim 1, wherein the step of determining comprises the steps of:
   a. measuring an amount of incident thermal energy in the at least one dose of illumination;
   b. determining an amount of thermal energy from the at least one dose of illumination reflected by the substrate; and
   c. subtracting the reflected thermal energy from the incident thermal energy to determine the amount of thermal energy absorbed by the substrate.

3. A method according to claim 1, wherein the step of determining comprises determining an approximate amount of energy absorbed by the substrate as a result of the illumination of the substrate.

4. A method according to claim 1, wherein said adjusting step comprises adjusting a predetermined location of at least one exposure on said substrate by a value corresponding to an amount of backlash determined in accordance with said absorbed thermal energy.

5. A method according to claim 4, further comprising a step of determining at least one coefficient indicative of a relationship between absorbed energy and an amount of backlash adjustment.

6. A method according to claim 5, wherein said adjusting step further comprises the step of multiplying said amount of absorbed thermal energy by said at least one coefficient to determine said amount of backlash adjustment corresponding to the amount of absorbed thermal energy.

7. A method according to claim 5, wherein the step of determining at least one coefficient comprises the steps of:
   a. exposing at least one sample substrate;
   b. determining an amount of thermal energy absorbed by said at least one sample substrate;
   c. determining a ratio of an amount of expansion in said at least one sample substrate to the amount of thermal energy absorbed by the at least one sample substrate; and
   d. storing the determined ratio in memory as the at least one coefficient.

8. A method according to claim 5, wherein said step of determining at least one coefficient includes a step of determining a first coefficient for adjustment in a first direction and a second coefficient for adjustment in a second direction, said step of determining said first and second coefficients including:
   a. exposing at least one sample substrate;
   b. determining an amount of thermal energy absorbed by said at least one sample substrate;
   c. determining a first ratio of an amount of expansion in said first direction in said at least one sample substrate to the amount of thermal energy absorbed by the at least one sample substrate;
   d. determining a second ratio of an amount of expansion in said second direction in said at least one sample substrate to the amount of thermal energy absorbed by the at least one sample substrate; and
   e. storing the determined first and second ratios in memory as the first and second coefficients.

9. A method to compensate for thermal expansion of a substrate in a lithographic exposure process comprising the steps of:
   a. exposing at least one exposure area of said substrate with a dose of illumination;
   b. determining an amount of energy absorbed by said substrate during said exposure of said at least one exposure area;
   c. determining an amount of backlash caused by said absorbed energy; and
   d. adjusting said exposure process to compensate for said backlash in accordance with said determined amount of energy absorption.

10. A method according to claim 9, wherein said adjusting step comprises the steps of:
    a. measuring a plurality of exposure sites on a substrate to be exposed;
    b. developing an alignment map based on said measuring of said plurality of exposure sites;
    c. adjusting said alignment map based on said determined amount of backlash; and
    d. exposing said substrate in accordance with said adjusted alignment map.

11. A method according to claim 9, wherein said step of determining an amount of backlash includes the step of multiplying the determined amount of energy absorbed by said substrate with at least one backlash coefficient.

12. A method according to claim 11, further including the step of determining at least one backlash coefficient.

13. A method according to claim 12, further including the step of determining said at least one backlash coefficient includes the steps of:
    a. exposing a plurality of substrates with at least one exposure energy;
    b. determining an amount of thermal absorption in each of said plurality of substrates caused by said exposure;
    c. measuring an amount of backlash in each of said plurality of substrates caused by said thermal absorption; and
    d. determining a backlash coefficient based on said measured amount of thermal expansion of said plurality of substrates.

14. An apparatus comprising:
    a source of illumination for illuminating a substrate with illumination of a predetermined wavelength;
    a movable substrate support mechanism for supporting said substrate;
    a reflectivity sensor for producing a reflectivity signal indicative of a detected reflectance;
    a transmission sensor for producing a transmission signal indicative of an amount of energy in said illumination; and
    a controller responsive to said reflectivity signal and said transmission signal for determining an amount of energy absorbed by said substrate from said illumination, said controller controlling a position of said movable substrate support mechanism to compensate for backlash in accordance with said determined amount of absorbed energy.

15. An apparatus according to claim 14, further comprising a memory for storing a plurality of coefficients of thermal expansion, said controller including a multiplier for multiplying the determined amount of absorbed energy by at least one of said coefficients of thermal expansion, wherein said position of said movable substrate support mechanism is controlled in accordance with a result of said multiplication.

16. A method of making a lithographic system, comprising;

providing a source of illumination for illuminating a substrate with illumination of a predetermined wavelength;

providing a movable substrate support mechanism for supporting said substrate;

providing a reflectivity sensor for producing a reflectivity signal indicative of a detected reflectance;

providing a transmission sensor for producing a transmission signal indicative of an amount of energy in said illumination; and providing a controller responsive to said reflectivity signal and said transmission signal for determining an amount of energy absorbed by said substrate from said illumination, said controller controlling a position of said movable substrate support mechanism to compensate for backlash in accordance with said determined amount of absorbed energy.

17. A method of making a lithographic system according to claim 16, further comprising the step of providing a memory for storing a plurality of coefficients of thermal expansion, said controller including a multiplier for multiplying the determined amount of absorbed energy by at least one of said coefficients of thermal expansion, wherein said position of said movable substrate support mechanism is controlled in accordance with a result of said multiplication.

* * * * *